United States Patent [19]
Gruetzner et al.

[11] Patent Number: 5,444,715
[45] Date of Patent: Aug. 22, 1995

[54] AC INTERCONNECT TEST OF INTEGRATED CIRCUIT CHIPS

[75] Inventors: Matthias Gruetzner, Stuttgart; Cordt W. Starke, Weil der Stadt, both of Germany

[73] Assignee: International Business Machines Corporation, Armonk, N.Y.

[21] Appl. No.: 69,466

[22] Filed: Jun. 1, 1993

[30] Foreign Application Priority Data

Jul. 17, 1992 [EP] European Pat. Off. ............ 92112213

[51] Int. Cl.⁶ ............................................... G01R 31/28
[52] U.S. Cl. ................................... 371/22.3; 371/22.1
[58] Field of Search ................... 371/15.1, 22.1, 22.3, 371/22.5, 25.1, 27

[56] References Cited

U.S. PATENT DOCUMENTS

| | | | |
|---|---|---|---|
| 4,428,060 | 1/1984 | Blum | 364/715 |
| 4,771,428 | 9/1988 | Acuff et al. | 371/25.1 |
| 4,994,732 | 2/1991 | Jeffrey et al. | 371/22.3 |
| 5,072,178 | 12/1991 | Matsumoto | 371/22.1 |
| 5,321,701 | 6/1994 | Raymond et al. | 371/27 |

OTHER PUBLICATIONS

M. J. Williams, et al., "Enhancing Testability of Large-Scale Integrated Circuits via Test Points and Additional Logic" IEEE Transactions on Computers, V. C-22, No. 1, pp. 46-60, Jan. 1973.
E. B. Eichelberger, et al., "A Logic Design Structure For LSI Testability" Proceedings for the Design Automation Conf., No. 14, pp. 462-468, Jun. 1977.
E. J. McCluskey, "A Survey of Design for Testability Scan Techniques" VLSI Design, pp. 38-61, Dec. 1984.
C. Maunder, et al., "Boundary-Scan A Framework for Structured Design-for-Test" International Test Conference Proceedings, pp. 714-723, 1987.
"Boundary Scan Design for Functional Clocks" IBM Technical Disclosure Bulletin, V. 33, No. 5, pp. 358-360, Oct. 1990.
"Design-for-Test Architecture" IBM Technical Disclosure Bulletin, V. 34, No. 1, pp. 182-183, Jun. 1991.
"AC Interconnect Test with Series Boundary Scan" IBM Technical Disclosure Bulletin, V. 34, No. 6, pp. 325-330, Nov. 1991.

Primary Examiner—Ellis B. Ramirez
Assistant Examiner—Edward Pipala
Attorney, Agent, or Firm—Charles W. Peterson, Jr.

[57] ABSTRACT

An integrated circuit chip (110) adapted to provide interconnect capability and an AC interconnect test method therefor. Test and control data are scanned in the scan-path of latches (114 and 115) to initialize the AC interconnect test. Subsequently the functional system mode is simulated by applying the functional-system clocks via lines (118 and 128).

10 Claims, 3 Drawing Sheets

AC INTERCONNECT TEST OF INTEGRATED CIRCUIT CHIPS

FIELD OF THE INVENTION

The invention relates to an integrated circuit (IC) chip adapted to provide AC interconnect capability and to an AC interconnect test method for testing the interconnection of at least two IC chips.

BACKGROUND OF THE INVENTION

One of the best known test methods for testing large scale integrated circuits is level sensitive scan design (LSSD) which is described in the article "A Logic Design Structure for LSI Testability" Proceedings of the Design Automation Conference, No. 14, 20-22, June 1977, New Orleans, La., by E. B. Eichelberger. See also U.S. Pat. No 4,519,078, U.S. Pat. No. 4,428,060 and E. J. McCluskey, "A Survey of Design for Testability Scan Techniques", VLSI Design, December 1984, pp. 38/61, for a comprehensive list of patents and publications for the testing of electronic structures.

Basically, LSSD utilizes a plurality of controllability/observability points internal to an LSI circuit. Controllability is provided by allowing data to be shifted into these points which are comprised of shift register latches (SRL's) in a serial manner. A test is then performed. The data stored in the SRL's is subsequently shifted back out for observation thereof. Therefore, control/observation of an LSI circuit does not depend on the number of pins in the package. Furthermore, because the latches themselves are part of the internal circuit, they can be utilized to break feedback paths in a sequential circuit, enabling the test for combinational circuits between SRL's to be generated automatically.

In a typical scan design, the shift registers are located at specific points required for the design function but are connected together in the scan chain for testing purposes. The scan chain allows for realization of any test state in the registers for test application. A test pattern is then generated on a computer. The generated test pattern is then shifted into the SRL's, test vectors (selected words or groups of digital data) applied to the primary inputs or pins of the chip, the system clocks applied to perform the test, the primary output pins compared to expected vector outputs and data scanned out of the SRL's to compare it to known good test vectors. In performing this test, numerous series of test vectors are usually required for shifting into the SRL's, applying the test vectors and then shifting the results back out. It is thus seen that in order to fully realize the potential of LSSD testing, test generation software must be able to generate the required test patterns for loading into the SRL's inside the chip. Even though this prior art method is suitable for testing individual IC chips, it does not provide for testing of connections between chips.

In IBM Technical Disclosure Bulletin, Volume 34, No. 6, November 1991, pp. 325-330, by P. K. Graham an AC interconnect test with series boundary scan is described. If an interconnection between two IC chips is to be tested according to this method, first an enable signal is applied to the corresponding driver. After the enabled driver switched on, a receiver clock is pulsed to capture the initialization values into the receiver latches. Only at this point, the timed portion begins. The A-clock of the system is pulsed to the driver data latch. Then, in a minimal, worst-case time after the A-clock, the receiver clock is pulsed to capture the driver data transitions in the receiver boundary latches. This is the end of the timed portion. Thus this prior art test method does not provide for an interconnect test that simulates system operation in the functional mode.

It is thus an object of the present invention to provide an IC chip having improved AC interconnect capability and to provide an improved AC interconnect test method.

According to the above cited prior art and especially according to the above cited Technical Disclosure Bulletin by P. K. Graham the enabling of a driver is not part of the timed portion of the functional or AC interconnect test. In the prior art it is considered to be sufficient to trigger and capture driver transitions between the two binary states once the driver is enabled in order to test the dynamic characteristics of the data transmission between two IC chips.

SUMMARY OF THE INVENTION

In contrast the invention is aimed to include the enabling of the driver which is to transmit test data to another IC chip into the timed portion of the test sequence. The driver may be e.g. a three state or open drain driver. This is to test the interconnection between chips for a maximum data transmission rate. For a maximum data transmission rate it is desirable that within one system cycle a driver in the sending chip is selected and enabled and the data which is sent by the sending chip is received and stored in another chip which is interconnected to the sending chip. According to the present invention it is not sufficient to test for maximum data transmission rate as it is required in the normal functional system mode without including the enabling of a driver of the sending chip within the timed portion of the test sequence. If the driver is enabled before the time critical test of the data transmission from the driver of the sending chip to the receiving chip begins, the functional system mode is therefore not sufficiently tested. This is because the enabling of a driver takes a relatively long period of time. Thus the enabling of the driver is a time critical step if data are to be transmitted from one chip to another chip with a maximum transmission rate, e.g. in just one system cycle. Including the enabling of a driver in the timed portion of an AC interconnect or functional test is thus an important feature of the invention.

According to the present invention the normal functional system mode is simulated as far as the timing is concerned in the inventive AC interconnect test. This is accomplished by initializing the test data to be output by the driver of the sending chip in a first storage means and by storing control data to control the data in a second storage means. Subsequently, the system is clocked like in the normal functional system mode, so that the control data which is to enable the driver is input into the driver as well as the test data which is to be sent to the receiving chip by the driver. If the interconnection between the two chips is operational, the test data are received in the receiving chip and stored therein within a predefined minimum amount of time such as one system cycle.

In preferred embodiments of the invention scan-paths are implemented. In the scan-path technique, as stated e.g. by Williams, "Enhancing Testability of Large-Scale Integrated Circuits via Test Points and Additional Logic", IEEE Transactions on Computers, January 1973, an IC chip is designed so that it has two modes of operation: One that is the normal functional mode and another one that is a test mode in which the circuit flip-flops are interconnected into a shift register. With the circuit in test mode, it is possible to shift an arbitrary test pattern into the flip-flops. By returning the circuit to normal mode for one clock period, the combinational circuitry can act upon the flip-flop contents and primary input signals and then store the results in the flip-flops. If the circuit is then placed into test mode, it is possible to shift out the contents of the flip-flops and compare these contents with the correct response. In the preferred embodiments of the invention considered here, the sending chip has a scan-path for the drivers. In this scan-path the test data as well as the control data are scanned-in before the AC interconnect test is carried out by returning to normal functional mode for one clock period. The receiving chip does have a scan-path assigned to its receiver. Thus the test data which are sent by the drivers of the sending chip are received by their corresponding receivers and stored in the corresponding scan-path of the receiving chip. The test data which are received in the receiving chip are subsequently shifted out to compare the received data with the sent data. It is advantageous to initialize the scan-path of the receiving chip with the inverted test data which are scanned-in the scan-path of the sending chip. This is to monitor data transitions in the scan-path of the receiving chip due to data received from the sending chip. If however random test data are scanned-in the scan-path of the sending chip and the AC interconnect test is repeated several times, scanning-in the inverted test data into the scan-path of the receiving chip is not necessary. This is due to the low probability that an accidental match of the initial data stored in the scan-path of the receiving chip and the test data which is to be transmitted by the sending chip occurs several times in sequence.

In further preferred embodiments of the invention level-sensitive scan design is used. LSSD is a scan-path design method for latch-based systems as presented by Eichelberger in the above cited article. Both of the scan-paths in the sending and receiving chips are advantageously implemented according to the level-sensitive scan design method.

According to a further preferred embodiment of the invention the scan-path of the sending chip comprises additional logic means to control the data flow. In the test mode, particular logical test data are required that are serially entered and subsequently shifted to the appropriate latch positions, if the circuit is operated in the shift mode, i.e. by inhibiting the system clock and by triggering the shift clock pulse to the circuit. The logical test data are commonly generated by known software techniques. It is possible to put the test data and the control data together into one test vector which is shifted into the scan-path. However, sometimes it is desirable to shift the test data into the test path independently of the control data which are to control the enabling of the drivers. This is accomplished by the additional logic means in the scan-path. If the test data are scanned-in the scan-path of the sending chip independently of the control data, the latches of the scan-path which are to store the control data are bypassed by the flow of the test data due to the control of the additional logic means.

The invention may also be used in others than level sensitive scan designs. Instead of initializing the control data in the scan-path, in some designs it is also possible to directly initialize the control data via a-dedicated pin of the IC chip. Further the invention is particularly beneficial in a boundary-scan architecture as described e.g. in IEEE Std. 1149.1 and C. M. Maunder, R. E. Tulloss, "The Test Access Port and Boundary-Scan Architecture", IEEE Computer Society Press, 1990.

BRIEF DESCRIPTION OF THE DRAWINGS

In the following further embodiments of the invention are described in more detail with reference to the drawing in which.

TECHNICAL DESCRIPTION OF THE PREFERRED EMBODIMENTS

Figure 1:
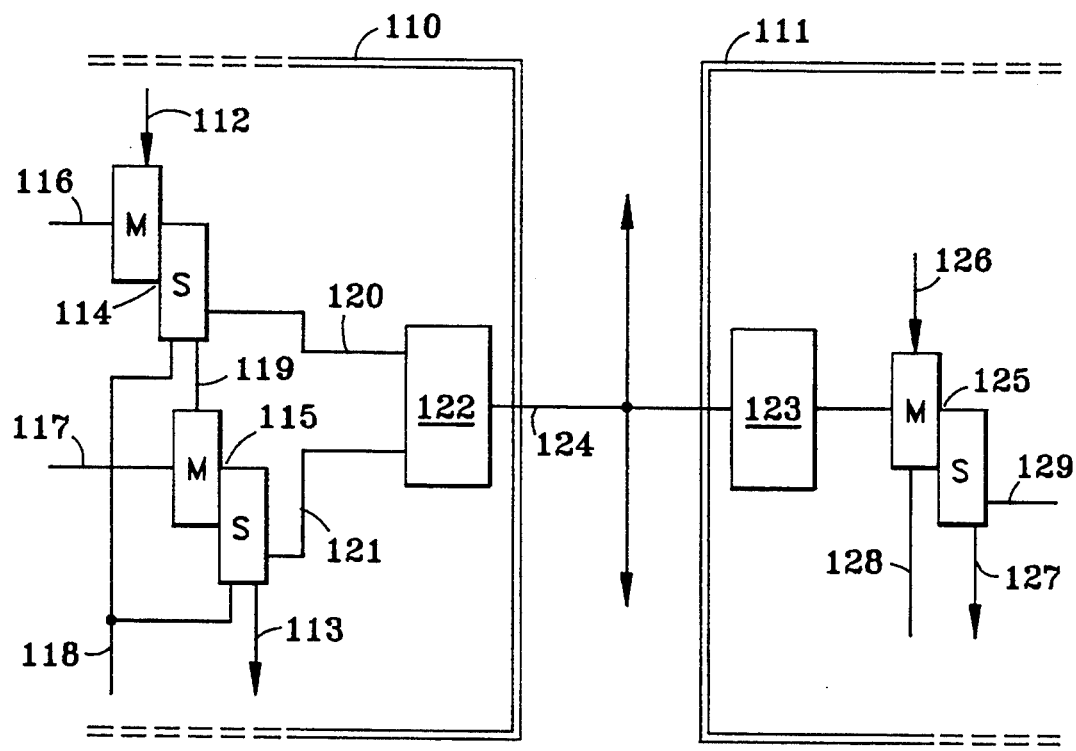
FIG. 1 schematic circuit diagram showing the interface of two IC chips according to a first embodiment of the invention.
Figure 2:
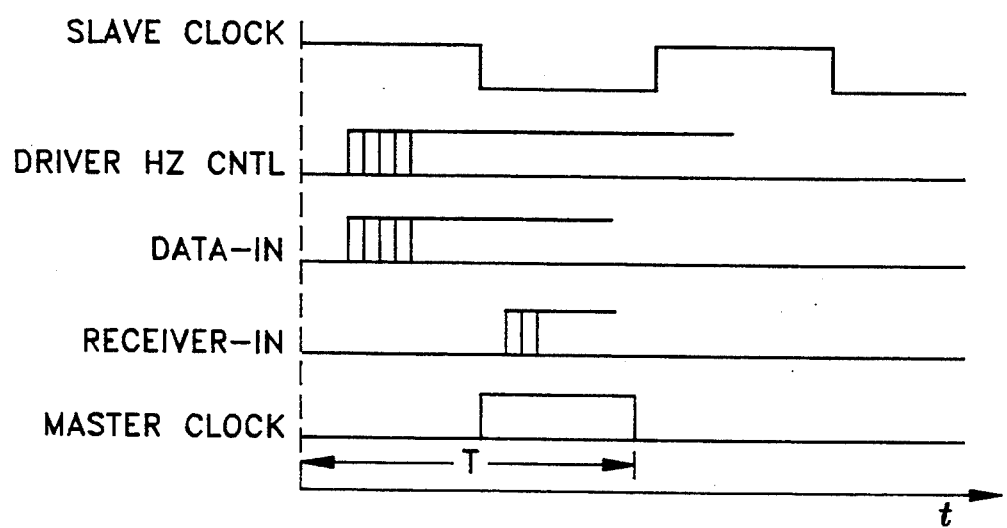
FIG. 2 is a timing diagram of the first embodiment shown in FIG. 1.

The first embodiment of the invention is explained now with reference to FIGS. 1 and 2. FIG. 1 shows the interface of two IC chips 110 and 111. The chip 110 is the sending chip, whereas the chip 111 is the receiving chip. The sending chip 110 comprises a driver 122 which is interconnected to a master slave latch 114 via line 120. Further the driver 122 is interconnected with a master slave latch 115 via the line 121. The slave latch S of the master slave latch 114 and the master latch M of the master slave latch 115 are interconnected via line 119. The slave latches S of the master slave latches 114 and 115 are clocked by the slave clock via line 118. The interconnected master slave latches 114 and 115 constitute a scan-path, whereby data are scanned-in via line 112 and scanned-out via line 113. In functional system mode data are input into the master slave latches 114 and 115 via lines 116 and 117 respectively.

The receiving chip 111 comprises a receiver 123 as well as a master slave latch 125. The master slave latch 125 constitutes or forms part of a scan-path, whereby data are scanned-in the scan-path via line 126 and scanned-out via line 127. The master latch M of the master slave latch 125 is clocked by the master clock via line 128. In normal functional system mode data is input into the master slave latch 125 by the receiver 123, whereas data is output from the slave S of the master slave latch 125 via line 129 to subsequent circuit elements.

The driver 122 and the receiver 123 of the two chips are interconnected by line 124 which in this case is a bus. If the AC interconnect test is to be performed, first the test data which is to be transmitted by the driver 122 is stored in the master M of the master slave flip-flop 114. In the preferred embodiment of the invention considered here, the driver 122 is implemented as a three state driver. A logical zero input via line 121 into the driver disables the driver, whereas a logical one enables the driver. Thus the corresponding control data is stored in the master M of the master slave latch 115. Further it is advantageous to store the inverted test data which is stored in the master of the master slave flip-flop 114 in the master slave flip-flop 125 of the receiving chip 111.

Second, after this initialization is performed, the normal functional system mode is simulated by applying the normal slave clock via line 118 as indicated by the timing diagram of FIG. 2 by the signal "SLAVE CLOCK". Thereby the data stored in both of the master latches M of the master slave latches 114 and 115 is input into the driver 122 via the lines 120 and 121, respectively. This is indicated by the signals "DATA-IN" and "DRIVER HZ CNTL", respectively, shown in the timing diagram of FIG. 2. After a certain time delay the receiver 123 receives the test data as it is indicated by the signal "receiver-in" of the timing diagram in FIG. 2. The data received by the receiver 123 in the receiving chip 111 is latched in the master M of the master slave flip-flop 125 by the following master clock signal which is transmitted via line 128. This is also shown by the signal "MASTER CLOCK" shown in FIG. 2. Subsequently the received data is scanned-out via line 127 and compared to the expected result.

It is thus possible according to the teaching of the invention to test whether the driver of the sending chip is selected and enabled and the data is transmitted, received and latched in one system cycle T as it is a requirement of the normal functional system mode. Obviously it is possible to have more than one driver in chip 110 and more than one receiver in chip 111 which correspondingly requires additional master slave latches in the scan-path to store test and control data. If the chip 110 comprises more than one driver 122 or if drivers of other chips such as chip 111 comprise further drivers 122 being interconnected to line 124 it is advantageous to select the control data so that no more than one driver being interconnected to the same line 124 is enabled at a time in order to protect the drivers against destruction.

Even though the master slave latches of this preferred embodiment are level sensitive, any other type of latches such as edge triggered latches may be employed as well.

Figure 3:
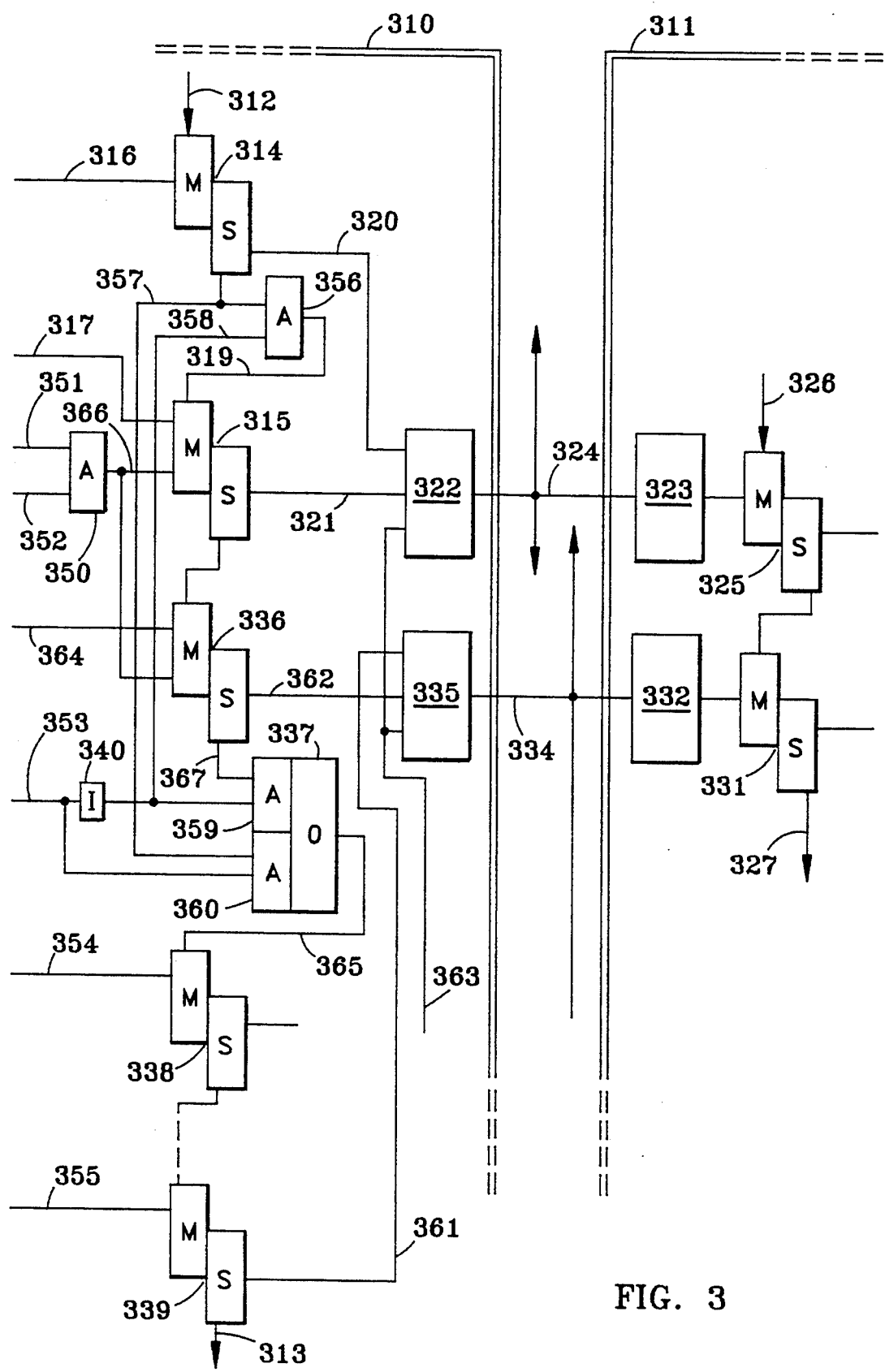
FIG. 3 is a schematic circuit diagram showing the interface of two IC chips according to a second embodiment of the invention.

In the following a second preferred embodiment of the invention is described with reference to FIGS. 3 and 4. FIG. 3 shows a sending IC chip 310 and a receiving IC chip 311. The sending IC chip 310 comprises two drivers 322 and 335. The drivers 322 and 335 are interconnected with a master slave latch 314 via line 320 and with a master slave flip-flop 339 via line 361, respectively. Further the drivers 322 and 335 are interconnected with the master slave latch 315 via line 321 and with the master slave latch 336 via line 362, respectively. The master slave latches 314, 315, 336 and 339 form part of a scan-path of the IC chip 310 as well as the master slave latch 338 which belongs to another driver of the IC chip 310 which is not shown in the drawing. Additional logic means are introduced in the scan-path: AND gate 356 is interconnected with the slave S of the master slave latch 314 via line 357 as well as to an input of an AND gate 360. The second input of the AND gate 356 is interconnected to an input of AND gate 359 via line 358. The output of AND gate 356 is interconnected with the master latch M of the master slave latch 315 via line 319. Further an AND/OR gate 337 is introduced into the scan-path. The gate 337 comprises the AND gates 359 and 360, whereby the inputs of the AND gate 359 are interconnected with the slave latch of the master slave flip-flop 336 via line 367 and to an input of the AND gate 356 as well as to an output Of the inverter 340 via line 358, respectively. The inputs of the AND gate 360 are interconnected with the slave latch S of the master slave flip-flop 314 via line 357 and to the input of the inverter 340, respectively.

Thus the scan-path in this preferred embodiment of the invention comprises in this order the latch 314, AND gate 356, latch 315, latch 336, gate 337, latch 338 and latch 339. Between the latches 338 and 339 an arbitrary number of additional circuit elements may be introduced, such as a repetition of the circuit shown in FIG. 3. Data are scanned-in the scan-path via input 312 and are scanned-out via output 313. In normal functional system mode data are input into the latches 314, 315, 336, 338 and 339 via the lines 316, 317, 364, 354 and 355 respectively. The master latches M of the latches 315 and 336 comprise additional inputs which are interconnected via line 366 with the AND gate 350. The AND gate 350 has inputs 351 and 352. Further the drivers 322 and 335 as well as the further driver which is not shown in the drawing are interconnected by line 363.

The receiving chip 311 comprises receivers 323 and 332 as well as the master slave latches 325 and 331. Latches 325 and 331 are interconnected to form a scan-path. Data are input in that scan-path via input 326 and output via output 327. The master latches M of the latches 325 and 331 are interconnected with the receivers 323 and 332, respectively. The receivers 323 and 332 are interconnected with the drivers 322 and 335 via lines 324 and 334, respectively.

In the following the AC interconnect test sequence according to the second preferred embodiment of the invention is described. As shown in FIG. 4 the AC interconnect test sequence is divided in the phases IT1, IT2, IT3, IT3.1, IT3.2, IT4 as shown in FIG. 4. The signals "—DI1", "ICT_GATE", "ICT_CLOCK" and "CHIP_SELECT" are applied to lines 363, 353, 352 and 351, respectively.

During the phase IT1 which is the set-up phase, all the drivers 322, 335 of the IC chip 310 are disabled by the signal "—DI1". This signal merely serves to isolate the chip 310 in order to prevent random signal transitions at the outputs of drivers 322, 335 during the shift in of data into the scan path. Applying this signal is thus optional. The signal "ICT_GATE" passes from a logical "zero" to a logical "one" during the phase IT1 as well as the signal "CHIP_SELECT", whereas the signal "ICT_CLOCK" remains inactive. Since the signal "ICT_GATE" is active now, the output of the inverter 340 is at logical "zero", so that the output of AND gate 356 is always at a logical "zero" as well as the output of the AND gate 359. Thus in the phase IT2 test data are scanned-in the latches 314, 338 and 339, whereas a logical "zero" is input into the master latches M of the latches 315 and 336 at the same time. This is due to the output of the AND gate 356 which is logical zero regardless of the test data which are scanned-in, because of the respective output of the inverter 340. If a logical zero is transmitted via lines 321 and 362 to the drivers 322 and 335, respectively, the drivers are disabled thereby.

In the following phase IT3.1 the signal "ICT_CLOCK" passes from logical zero to logical one. Since the signal "CHIP_SELECT" is at logical one as well, the output of AND gate 350 is logical one. This logical one is input via line 366 into the master latches M of latches 315 and 336 which store the control data for the drivers 322 and 335, respectively. With the following slave clock pulse the logical one stored in the master latches M of latches 315 and 336 as well as the test data stored in the master latches M of latches 314 and 339 is transferred to the corresponding slaves S, so that a logical one is transmitted via lines 321 and 362 to the drivers 322 and 335, respectively. Since a logical one enables drivers 322 and 335, the data stored in the slave latch S of latches 314 and 339 and thus present at the corresponding inputs of the drivers 322 and 335 via the lines 320 and 361, respectively, are transmitted via lines 324 and 334 to the receivers 323 and 332 of the receiving chip 311. This corresponds to the signals "SLAVE CLOCK", "DRIVER HZ CNTL" and "DATA-IN" as explained with reference to FIGS. 1 and 2.

After a certain time delay the receivers 323 and 332 receive the data sent by the drivers 322 and 335, respectively, so that with the following master clock pulse the received data are latched in the masters M of latches 325 and 331, respectively. This corresponds to the signals "RECEIVER-IN" and "MASTER CLOCK" as explained with reference to FIGS. 1 and 2. The received data are latched in the master latches M in the phase IT3.2 of the phase IT3. It is to be noted that the signal "—DI1" passes from logical zero to logical one at the beginning of the phase IT3. The signal remains at logical one at least until the drivers 322 and 335 send the test data, since otherwise the drivers would be disabled.

In the phase IT4 the received test data which are stored in the scan-path of the receiving chip 311 are scanned-out via line 327 in the test mode.

It is to be noted that the clocking applied during the phases IT3.1 and IT3.2 is the clocking of the functional system mode as illustrated by the respective signals "SLAVE CLOCK" and "MASTER CLOCK" shown in FIG. 2. Thus the timing of the interconnection between the two chips 310 and 311 is tested under conditions corresponding to the normal functional mode.

Figure 4:
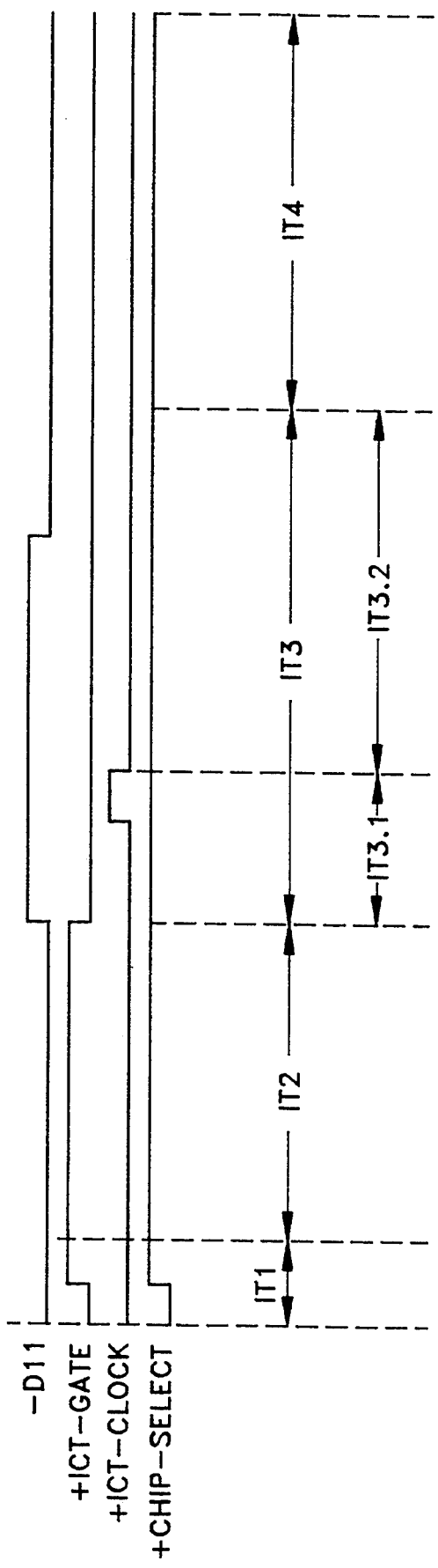
FIG. 4 is a timing diagram of the second embodiment shown in FIG. 3.

Further it is to be understood that according to the control signal applied at line 353 which in this case is the signal "ICT_GATE" of FIG. 4 it is also possible not to bypass the latches 315 and 336 during the scan-in of data via the line 312. If the latches 315 and 336 are not to be bypassed by the scan-in data; the signal at line 353 is at logical zero, so that the output of the inverter 340 is at logical one. Thus the data output by the slave latch S of latch 314 is passed to the latch 315 whereas the output of the slave latch S of the latch 336 is passed via lines 367 and 365 through the gate 337. In this case the operation of the system shown in FIG. 3 is equivalent to that of FIG. 1, since the data which are scanned-in comprise test data and control data in due order. In this case sets of control data are interleaved in the sequence of test data which are scanned-in via line 312, so that latches 315, 336 which control the drivers 322, 335 have the control data stored in their master latches M after the scan-in.

The above described inventive concept is particularly beneficial when time critical signal transitions are to be tested. Particularly time critical signal transitions occur if the data signal which is input into the driver e.g. via lines 320 and 361 changes at the same time as the driver is enabled by the respective control data applied e.g. via lines 321 and 362.

It is to be noted that a plurality of the integrated circuit chips according to the invention may be mounted on a chip carrier such as a module or on a printed circuit board. Testing of the interconnections according to the inventive method is advantageously performed between chips being mounted on the same module or card, or chips being mounted on different modules or cards.

While the present invention is described herein in terms of preferred embodiments, numerous variations and modifications will occur to those skilled in the art without departing from the spirit or scope of the invention. It is intended that the appended claims be construed to include the preferred embodiments and all such variations and modifications in form and detail that fall within the spirit and scope of the invention.

We claim:

1. Integrated circuit chip adapted to provide AC interconnect test capability comprising
   driver means (122, 322, 335) for sending test data to a second integrated chip;
   first storage means (114, 314, 339) for storing said test data, said first storage means comprising a Master Slave latch, said stored test data being provided from a Slave latch of the Master Slave latch of said first storage means to said driver means responsive to a system clock; and
   second storage means (115, 315, 336) for storing control data, said second storage means comprising a Master Slave latch, the Slave latch of said second storage means controlling said driver means responsive to said system clock,
   whereby a system clock simultaneously clocks said second storage means and said first storage means during said AC interconnect test.

2. The integrated circuit chip according to claim 1, wherein said driver means is an open drain driver or a three state driver.

3. The integrated circuit chip according to claim 1 wherein said first and said second storage means are shift register latches.

4. The integrated circuit chip according to claim 1, wherein said first storage means and said second storage means is included in a scan-path of a level sensitive scan.

5. The integrated circuit chip according to claim 1, wherein said first storage means and said second storage means is included in a boundary scan path.

6. The integrated circuit chip according claim 1 further comprising logic means (356, 359, 360, 337) for controlling the data flow between said first and second storage means, whereby said test data is scanned in said first storage means, so that said second storage means is bypassed selectively based on the control of said logic means.

7. The integrated circuit chip according to claim 1, wherein said second storage means is selectively loaded with control data.

8. An AC interconnect method for testing the interconnection of at least a first and a second integrated circuit chip, said first chip comprising
   driver means (122,322,335) for sending test data to said second integrated circuit chip,
   first storage means (114, 314, 339) for storing said test data, said first storage means comprising a Master Slave latch, said stored test data being provided from a Slave latch of the Master Slave latch of said first storage means to said driver means responsive to a system clock,
   second storage means (115, 315, 336) for storing control data, said first storage means comprising a Master Slave latch, said stored test data being provided from a Slave latch of the Master Slave latch of said first storage means to said driver means responsive to said system clock, said second chip comprising
- receiver means (123, 323, 332) for receiving said test data sent from said driver means, and
- third storage means (325, 331) for storing said test data received, said third storage means comprising a Master Slave latch, a Master latch of said third storage means receiving said received test data from said receiver means from said driver means responsive to said system clock, said method comprising the steps of:
a) loading test data into said first storage means,
b) loading control data into said second storage means,
c) clocking said first and second storage means by said system clock so that said test and control data are input into said driver means, and
d) clocking said third storage means by said system clock to store test data received from said driver means by said receiver means into the Master latch of said third storage means.

9. The method according to claim 8, wherein said steps of loading test data and loading control data are realized by
- scanning said test data into said first storage means, whereby said second storage means is bypassed, or
- if said test data is organized in a test vector and said test vector also comprises said control data, scanning said test vector into a scan-path comprising said first and second storage means.

10. The method according to claim 8 or 9 further comprising the steps of inverting said test data and scanning said inverted test data into said third storage means prior to said step of clocking c).

* * * * *